(12) United States Patent
Ilic et al.

(10) Patent No.: US 8,357,266 B2
(45) Date of Patent: *Jan. 22, 2013

(54) METHOD AND SYSTEM FOR CONTROLLING A VAPOR DEPOSITION PROCESS

(75) Inventors: Milan Ilic, Fort Collins, CO (US); Robert B. Huff, Fort Collins, CO (US); George W. McDonough, Loveland, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1162 days.

This patent is subject to a terminal disclaimer.

(21) Appl. No.: 12/212,506

(22) Filed: Sep. 17, 2008

(65) Prior Publication Data

US 2009/0008240 A1 Jan. 8, 2009

Related U.S. Application Data

(63) Continuation of application No. 11/413,434, filed on Apr. 28, 2006, now Pat. No. 7,445,695.

(51) Int. Cl.
*C23C 14/34* (2006.01)

(52) U.S. Cl. ......... 204/192.12; 204/192.13; 204/298.03; 204/298.08

(58) Field of Classification Search ............. 204/192.12, 204/192.13, 298.03, 298.08
See application file for complete search history.

(56) References Cited

U.S. PATENT DOCUMENTS

| | | | |
|---|---|---|---|
| 5,651,865 A | 7/1997 | Sellers | |
| 5,660,700 A | 8/1997 | Shimizu et al. | |
| 5,718,813 A | 2/1998 | Drummond et al. | |
| 5,810,982 A | 9/1998 | Sellers | |
| 5,993,615 A | 11/1999 | Abry et al. | |
| 6,007,879 A | 12/1999 | Scholl | |
| 6,074,279 A | 6/2000 | Yoshimura et al. | |
| 6,113,760 A | 9/2000 | Kuriyama et al. | |
| 6,171,454 B1 | 1/2001 | Weber et al. | |
| 6,368,477 B1 | 4/2002 | Scholl | |
| 6,426,302 B2 | 7/2002 | Kitagawa | |
| 6,451,389 B1 | 9/2002 | Amann et al. | |
| 6,818,257 B2 | 11/2004 | Amann et al. | |
| 7,247,221 B2 | 7/2007 | Stowell, Jr. | |
| 7,445,695 B2 * | 11/2008 | Ilic et al. | 204/192.12 |
| 2003/0234175 A1 | 12/2003 | Teng | |
| 2004/0182697 A1 | 9/2004 | Buda | |

OTHER PUBLICATIONS

Bruce Fries, "Power Supplies Advance Beyond Volts and Amps", "Semiconductor", Jun. 2, 2003, p. 6 vol. 26, No. 6, Publisher: Reed Business Information, Published in: US.

Christie, DJ, et al., "Arc Handling Considerations for DC Sputtering Power Supplies", "Annual Technical Conference Proceedings", Jan. 1, 2005, pp. 39-43, Publisher: Society of Vacuum Coaters, Published in: US.

Hans Ekhult, "Supplementary European Search Report re Application No. EP 07 76 1416", Apr. 21, 2010, Published in: EPO.

McDonald, Rodney G., "PCT/US07/67589 Search Report dated Aug. 5, 2008".

Advanced Energy, "Pinnacle Series DC Magnetron Power Supplies, Brochure", 2006, p. 4, Published in: US.

* cited by examiner

Primary Examiner — Rodney McDonald
(74) Attorney, Agent, or Firm — Neugeboren O'Dowd PC

(57) ABSTRACT

A method and system for conditioning a vapor deposition target is described. In one illustrative embodiment, a vapor deposition system is operated in which a vapor deposition target is used, the occurrence of electrical arcs in the vapor deposition system is detected, and the vapor deposition target is conditioned by adjusting an output current of a power supply that powers the vapor deposition system and adjusting an interval during which energy is delivered to each arc to deliver substantially the same energy to each arc. In some embodiments, the energy delivered to each arc is approximately equal to the maximum energy that the vapor deposition target can withstand without being damaged. The described method and system significantly reduces the time required to remove impurities from a target and does not require the venting of the vacuum chamber or the removal of the target from the chamber.

18 Claims, 7 Drawing Sheets

METHOD AND SYSTEM FOR CONTROLLING A VAPOR DEPOSITION PROCESS

PRIORITY

The present application is a Continuation of and claims the benefit of U.S. patent application Ser. No. 11/413,434 entitled "METHOD AND SYSTEM FOR CONDITIONING A VAPOR DEPOSITION TARGET" filed Apr. 28, 2006 now U.S. Pat. No. 7,445,695, which is incorporated herein by reference.

FIELD OF THE INVENTION

The present invention relates generally to the application of thin films through vapor deposition. In particular, but without limitation, the present invention relates to methods and systems for conditioning a target material used in vapor deposition.

BACKGROUND OF THE INVENTION

The application of thin films through vapor deposition is an important manufacturing process in a wide variety of industries, including semiconductor manufacturing, glass coating, the manufacture of compact discs (CDS), decorative coatings, and the manufacture of flat panel displays. In chemical vapor deposition (CVD), a substrate is exposed to one or more chemical precursors, which react with or decompose on the substrate to form the desired film. In physical vapor deposition (PVD), the thin film is deposited on the substrate through physical rather than chemical means. Examples of PVD include evaporation, sputtering, and radio-frequency (RF) plasma processes.

In a sputtering process, for example, electrical energy is used to ionize a gas within an evacuated coating chamber, generating a "plasma." The positively charged ions of the plasma bombard a material called the "target," causing atoms of the target to be knocked free. The majority of these atoms are electrically neutral ions that "drift" from the target to the substrate, where they condense or react with the substrate to form a thin film on the substrate. Common sputtering targets include aluminum, boron, copper, iron, nickel, silver, titanium, and zinc.

Contamination of the target is a significant problem in plasma-based deposition processes. A target may become contaminated in a variety of ways. For example, the surface of the target may become oxidized or contaminated before it is placed in the chamber by exposure to air, water vapor, or airborne hydrocarbons. A target may also become contaminated during the vapor deposition process. Some of the sputtered material may be re-deposited onto surfaces outside the target erosion area or "racetrack." This re-deposited material has a different structure from the target material and can lead to electrical arcing on the surface of the target. Arcing can affect the quality of the deposited film by introducing particulate matter into the film. Yet another source of contamination is an arc in the so-called "cathode dark space" (the physical space between the target—the negative-potential element in many applications—and ground). When such an arc occurs, deposition is severely affected, and damage to the target or the substrate may result in addition to the contamination of the target, the substrate, or both.

There are a variety of methods for conditioning or removing impurities from a target. For example, the target may be physically (i.e., manually) cleaned. Another approach is to operate the sputtering process with the contaminated target for a period sufficient to "burn off" the impurities. In this approach, the substrate may be omitted from the chamber, or "dummy" substrates or actual substrates that are simply discarded may be used. A different approach involves blasting the surface of the target with a finely divided powder having a particular range of particle diameters. An alternative method involves using reverse bias pulses to perform target conditioning while eliminating arcing entirely.

Conventional methods for conditioning a vapor deposition target often require significant time (e.g., several hours) to complete, the venting of the vacuum chamber and the removal of the target, or both. It is thus apparent that there is a need in the art for an improved method and system for conditioning a vapor deposition target.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

The present invention can provide a method and system for operating a vapor deposition process. One illustrative embodiment is a method including operating a vapor deposition system in which a vapor deposition target is used, detecting the occurrence of electrical arcs in the vapor deposition system, and adjusting a level of current output from a power supply that provides power to the vapor deposition system and adjusting an interval during which energy is delivered to each arc to deliver substantially the same energy to each arc.

These and other embodiments are described in greater detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
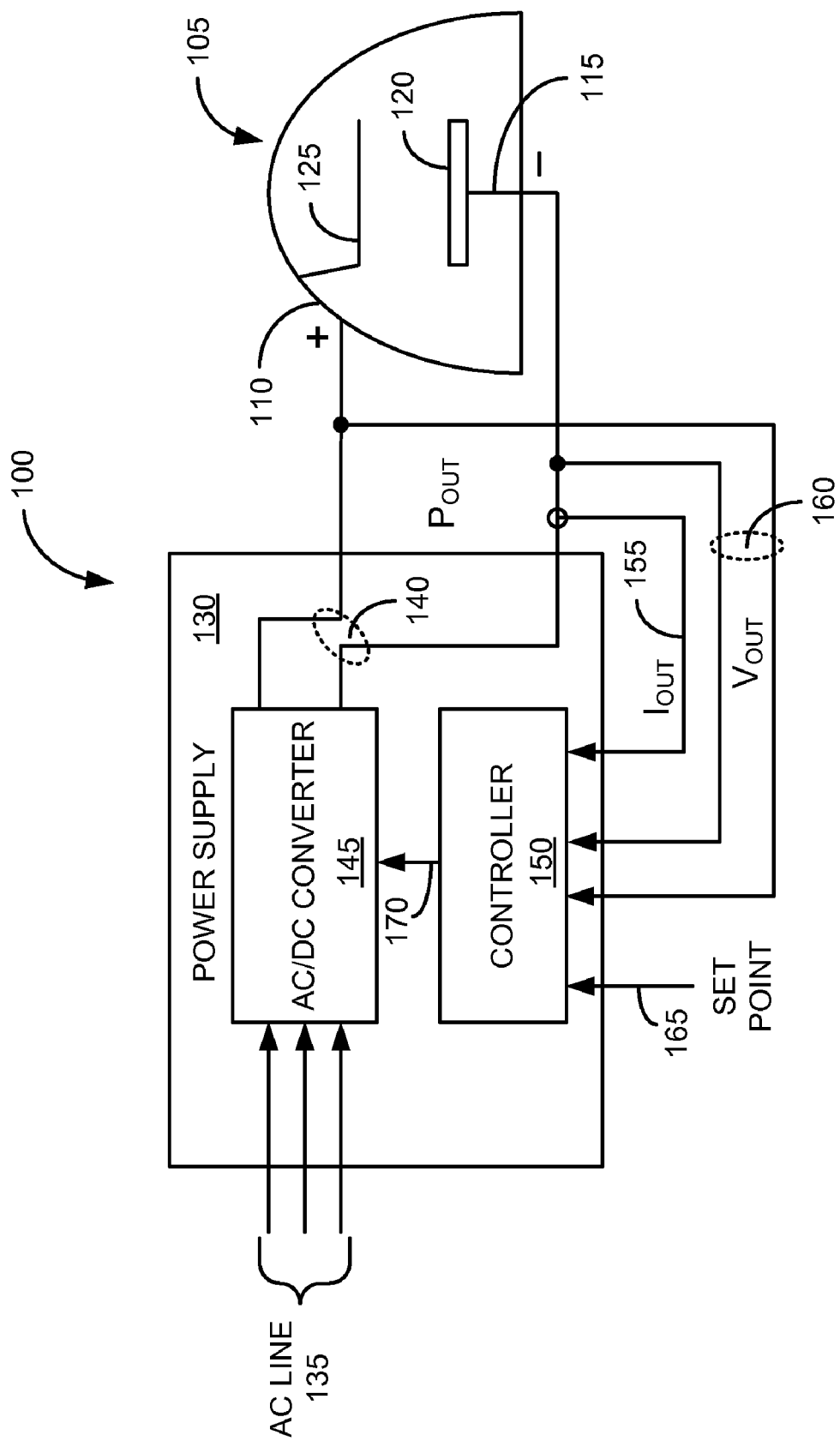
FIG. 1 is a functional block diagram of a vapor deposition system, in accordance with an illustrative embodiment of the invention.

In an illustrative embodiment, a vapor deposition target is conditioned by operating a vapor deposition system in which a vapor deposition target is used, detecting electrical arcs that occur in the vapor deposition system, and adjusting the output current of the power supply that powers the vapor deposition system and adjusting an interval during which energy is delivered to each arc to deliver substantially the same energy to each arc. In this way, substantially constant arc energy is delivered from arc to arc.

Furthermore, a vapor deposition target is optionally conditioned more rapidly and efficiently by making the constant energy delivered to each arc approximately equal to the maximum energy that the target can withstand without damage. This maximum energy ($E_{max}$), commonly referred to as the "energy of fusion" or "heat of fusion," is determined beforehand based on the target material and the size of the target. The vapor deposition process is then operated with the contaminated target in a "target-conditioning mode."

During target conditioning, arcing is detected. The energy delivered to an arc is calculated as $E_{del} = V_{out} \cdot I_{out} \cdot \Delta t$, where $\Delta t$ is an interval during which energy is delivered to the arc, $E_{del}$ is the energy delivered to the arc, $V_{out}$ is the output (arc) voltage during $\Delta t$, and $I_{out}$ is the output (arc) current during $\Delta t$. The interval $\Delta t$ is implemented as, for example, an "arc delay time" during which normal arc handling procedures are disabled once an arc has been detected. Normal arc handling may include, for example, switching off the power supply for a predetermined period to extinguish the arc. Since $V_{out}$ and $I_{out}$ can be measured, $\Delta t$ is calculated such that $E_{del}$ equals a desired predetermined level of energy. In some embodiments, $V_{out}$ is approximated as a predetermined constant (e.g., 30-50V) during the arc delay time $\Delta t$ so that only output current needs to be measured. A control loop is constructed in which $I_{out}$ and $\Delta t$ are adjusted to deliver substantially the same energy to each detected arc. Optionally, the like energy delivered to each arc ($E_{del}$) is made approximately equal to $E_{max}$. In some embodiments, the target-conditioning mode or cycle is continued until the measured frequency of arcing drops below a predetermined threshold, at which time normal vapor deposition begins or resumes.

If, during an arcing event, $E_{del}$ becomes equal to $E_{max}$, the power supply is shut down for a predetermined period to extinguish the arc. If the arc ends before $E_{del}$ reaches $E_{max}$, the power supply continues normal operation after the end of the arc is detected.

To control the current delivered to an arc, the power supply is operated in a constant current mode when an arc is detected. When the frequency of arcing is high (e.g., above the predetermined threshold), the power supply is configured to produce output current that is inversely proportional to the arc frequency. In one illustrative embodiment, the power supply is operated in a current regulation mode in which the output current is held constant at a predetermined level regardless of whether an arc is present.

The approach to target conditioning just described provides a significant speed advantage over conventional techniques. Operating the power supply at normal power for most of the target conditioning cycle and delivering the maximum amount of energy to the target during the arc delay time $\Delta t$ can cut conditioning time from 4-5 hours to just one hour.

Further information on DC sputtering processes and control of arcing in such processes can be found in commonly owned and assigned U.S. Pat. No. 5,718,813, "Enhanced Reactive DC Sputtering System." Further information on target conditioning can be found in the following commonly owned and assigned U.S. Pat No. 6,368,477, "Adjustable Energy Quantum Thin Film Plasma Processing System"; and U.S. Pat. No. 6,451,389, "Method for Deposition of Diamond Like Carbon."

Referring now to the drawings, where like or similar elements are designated with identical reference numerals throughout the several views, FIG. 1 is a functional block diagram of a vapor deposition system 100, in accordance with an illustrative embodiment of the invention. In this particular illustrative embodiment, vapor deposition system 100 is a direct-current (DC) sputtering system. The principles of the invention apply generally, however, to any vapor deposition process in which arcing is a concern, including, without limitation, physical vapor deposition (PVD) processes such as evaporation and sputtering. The principles of the invention are applicable, without limitation, to DC, alternating-current (AC), pulsed-output, and RF-output processes.

In FIG. 1, vapor deposition system 100 includes a coating chamber 105 having an anode 110 and a cathode 115 with which a target 120 is electrically connected. In this illustrative embodiment, target 120 itself serves as cathode 115. In other embodiments, target 120 serves as anode 110 or is electrically connected with anode 110. In the illustrative embodiment shown in FIG. 1, anode 110 may coincide with the wall of coating chamber 105. In some embodiments, anode 110 is at ground potential, and the target (cathode) is at negative potential. Target 120 and a substrate (or work piece) 125 are disposed within coating chamber 105. During the deposition process, coating chamber 105 is evacuated, and a noble gas such as Argon (not shown in FIG. 1) is introduced into coating chamber 105. The gas, when "ignited" by electrical energy, becomes a plasma, the positive ions of which bombard target 120, causing atoms of the target material to be knocked free ("sputtered") and deposited as a film onto substrate 125.

Vapor deposition system 100 also includes power supply 130. For simplicity, only the relevant functional blocks within power supply 130 have been included in FIG. 1. Power supply 130 includes an input stage (not shown in FIG. 1) that receives AC input power from AC line 135. At output 140 of an output stage of power supply 130 (not shown in FIG. 1), power supply 130 produces DC output power (Pout). Output 140 is connected to anode 110 and cathode 115 of coating chamber 105. AC/DC converter 145 converts AC input power from AC line 135 to DC power for exciting the plasma.

Controller 150 controls the operation of AC/DC converter 145. In one illustrative embodiment, controller 150 is an embedded computing device that includes a central processing unit (CPU) and memory containing stored program instructions. In general, the functionality of controller 150 is implemented in hardware, software, firmware, or some combination thereof. Controller 150 receives output-current sense line 155, output-voltage sense lines 160, and a user-specified power set point 165 as inputs. Control line 170 allows controller 150 to AC/DC converter 145. For example, controller 150 may change the duty cycle ratio or switching frequency of AC/DC converter 145. A power supply such as power supply 130 is often referred to as a "switch-mode power supply." Power supply, under control of controller 150, is switched on and off rapidly to control arcing within coating chamber 105.

In an illustrative embodiment, controller 150 is configured to detect electrical arcs and to adjust the output current ($I_{out}$) and $\Delta t$ to deliver substantially the same energy to each detected arc. Optionally, $E_{del}$ is set to be approximately equal to the predetermined $E_{max}$ of the particular target 120. In one embodiment, controller 150 is configured to remain in a target-conditioning mode until the measured frequency of arcs falls below a predetermined threshold, after which the normal vapor deposition process is resumed. As those skilled in the art are aware, controller 150 can detect arcs by, for example, monitoring voltage sense lines 160, current sense line 155, or both.

In one embodiment, controller 150 is configured to switch power supply 130 to a constant current mode, when an arc is detected. This controls the amount of current delivered to the arc during the arc delay time $\Delta t$. If the measured arc frequency is above a predetermined threshold, controller 150 is further configured, in this embodiment, to regulate the output current ($I_{out}$) to be inversely proportional to the arc frequency. As explained above, controller 150 is configured to calculate $\Delta t$ based on the desired $E_{del}$, $I_{out}$, and the output voltage ($V_{out}$) by measuring both $I_{out}$ and $V_{out}$. In a different illustrative embodiment, controller 150 is configured to approximate $V_{out}$ as a constant, in which case only $I_{out}$ needs to be measured.

Figure 2:
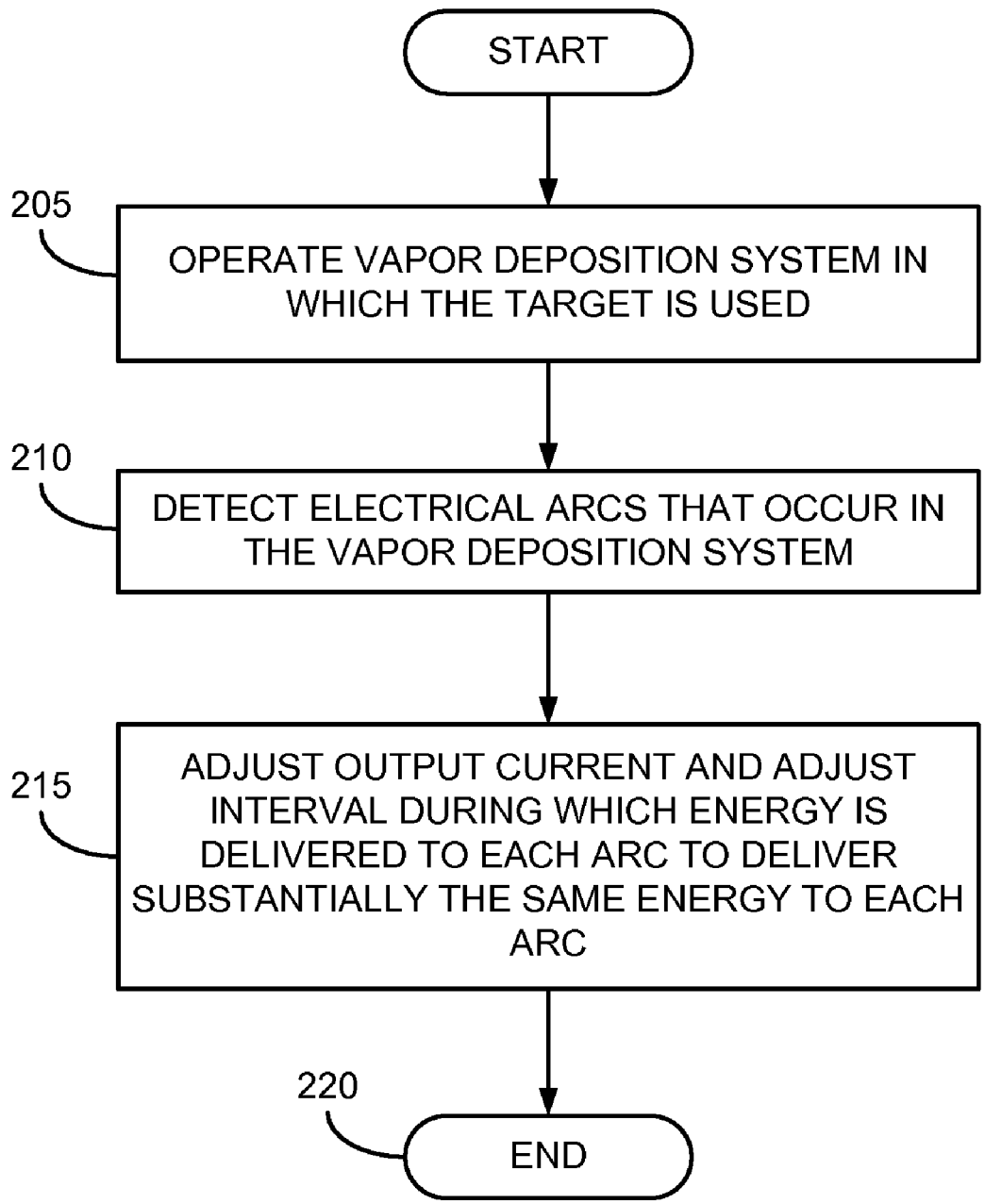
FIG. 2 is a flowchart of a method for conditioning a vapor deposition target, in accordance with an illustrative embodiment of the invention.

FIG. 2 is a flowchart of a method for conditioning a vapor deposition target 120, in accordance with an illustrative embodiment of the invention. At 205, vapor deposition system 100 is operated using target 120. At 210, controller 150 detects electrical arcs that occur during the vapor deposition process. At 215, controller 150 adjusts $I_{out}$ and $\Delta t$ to deliver more or less the same energy $E_{del}$ to each arc detected at 210. In some embodiments, $E_{del}$ is approximately equal to $E_{max}$. $E_{max}$, which depends on the material from which target 120 is made and the size of target 120, can be determined by consulting readily available references such as *The Handbook of Chemistry and Physics*, published by CRC Press, LLC. Once target 120 has been conditioned, the process terminates at 220.

Figure 3:
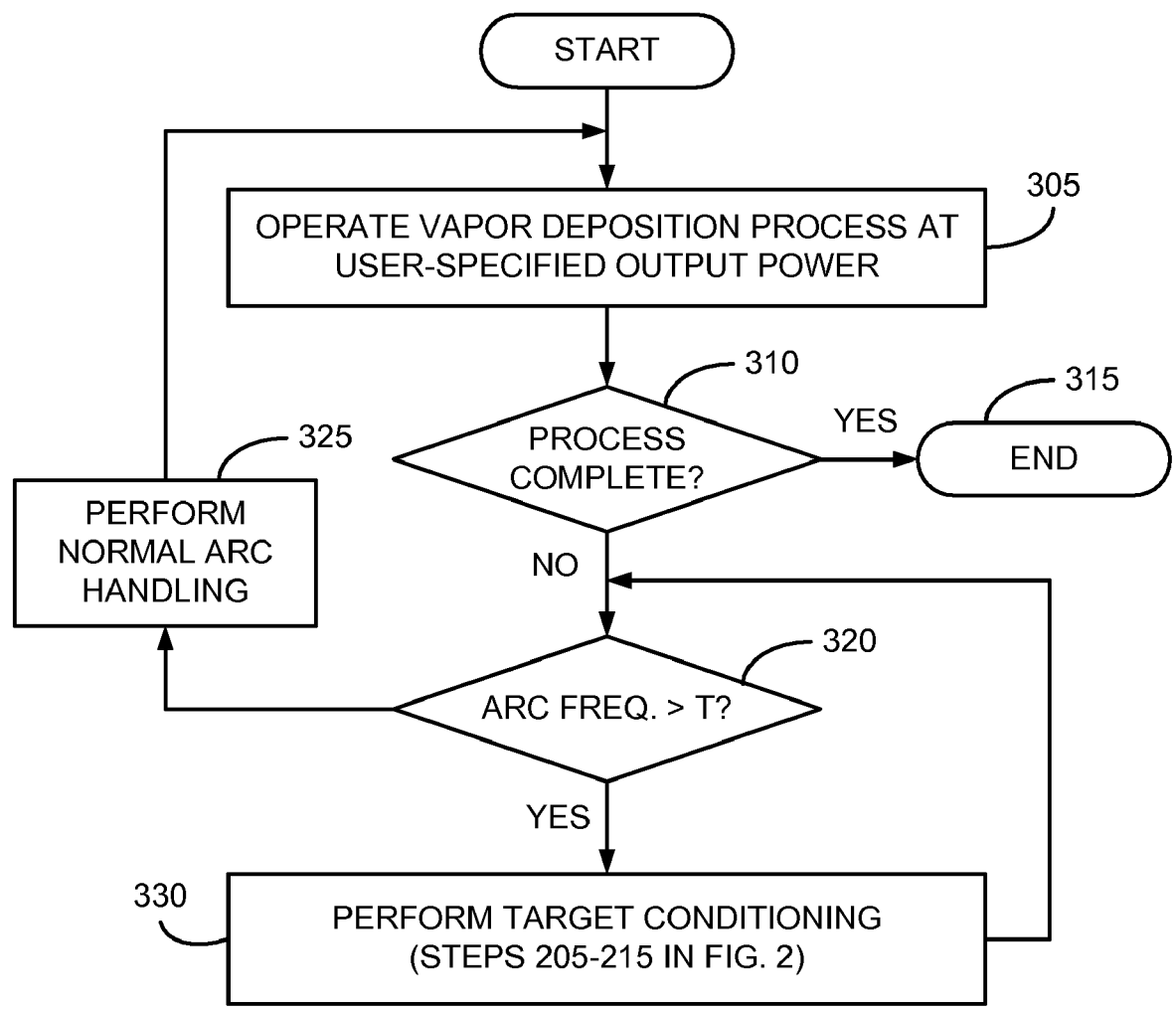
FIG. 3 is a flowchart of a method for controlling a vapor deposition process, in accordance with an illustrative embodiment of the invention.

FIG. 3 is a flowchart of a method for controlling a vapor deposition process, in accordance with an illustrative embodiment of the invention. Initially, vapor deposition system 100 is operated at user-specified output power (set point 165) at 305. If the vapor deposition process is complete at 310, the process terminates at 315. Otherwise, the process proceeds to 320. If controller 150 measures an arc frequency (in units of, e.g., arcs per second) exceeding a predetermined threshold T at 320, vapor deposition system 100 can switch to a target-conditioning mode at 330 in which steps 205, 210, and 215 in FIG. 2 are performed until the arc frequency is less than or equal to T (or strictly less than T, depending on the particular embodiment). Once the arc frequency has satisfied the specified criterion, the process may return to steps 305-325 until the process is complete or the arc frequency again exceeds T. At 325, while vapor deposition system 100 is operating in a normal deposition mode rather than in the target-conditioning mode, vapor deposition system 100 may employ normal arc handling in which power supply 130 is switched off for a predetermined period to extinguish an arc. The illustrative embodiment shown in FIG. 3 has the advantage of allowing target 120 to be conditioned without the need to vent coating chamber 105 or remove target 120 from coating chamber 105 for physical cleaning.

Figure 4A:
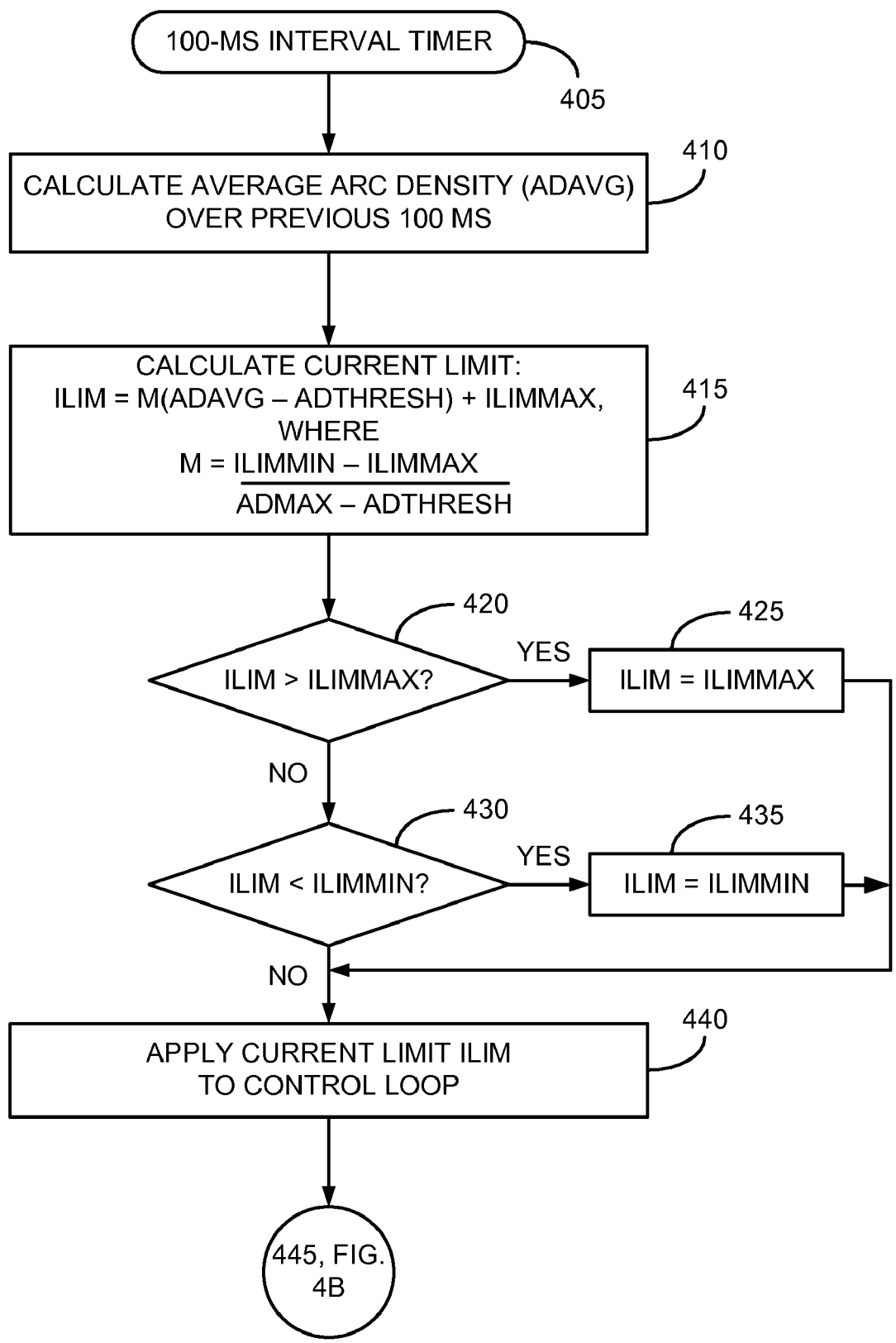
FIGS. 4A and 4B are a flowchart of a method for conditioning a vapor deposition target, in accordance with another illustrative embodiment of the invention.
Figure 4B:
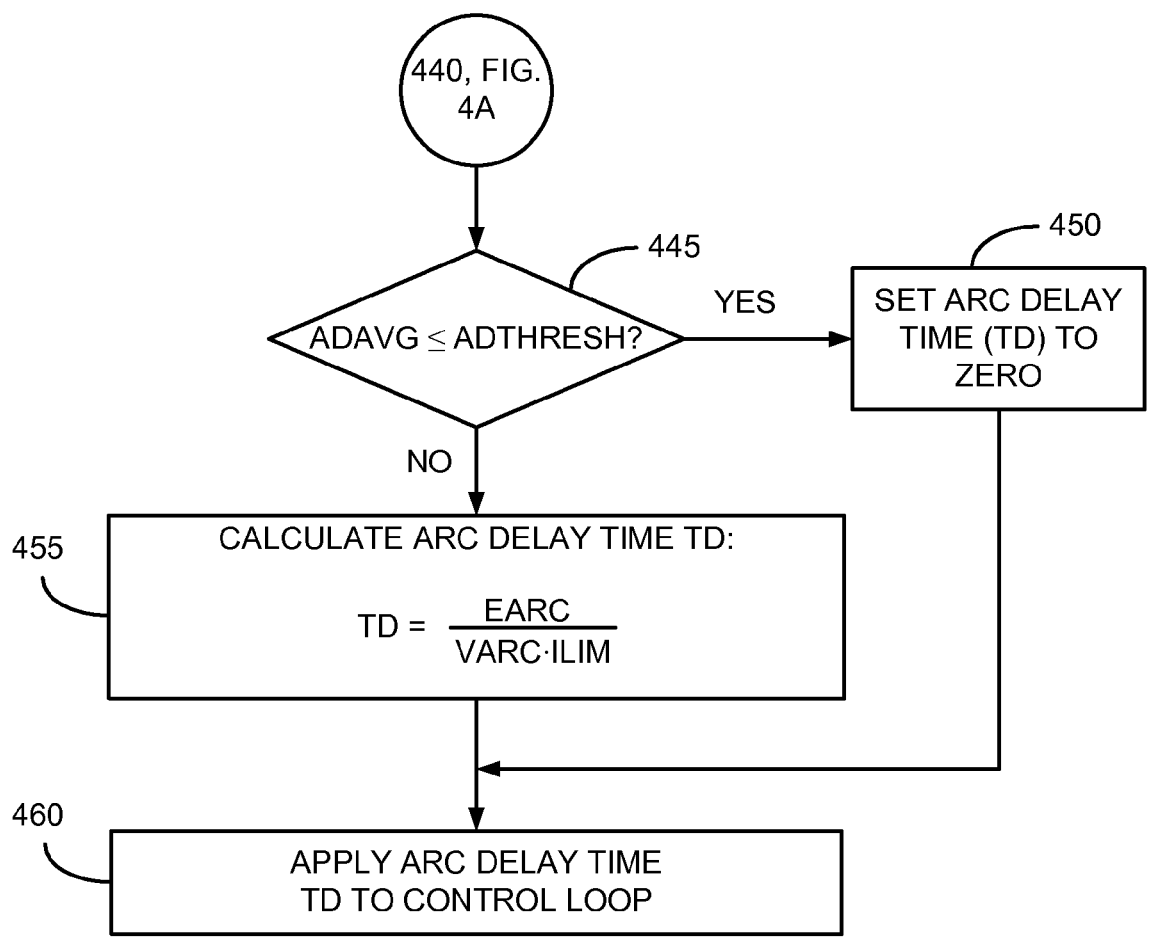

FIGS. 4A and 4B are a flowchart of a method for conditioning a vapor deposition target 120, in accordance with another illustrative embodiment of the invention. The steps shown in FIGS. 4A and 4B are performed periodically at a predetermined interval. In the particular illustrative embodiment shown, this interval is 100 ms (block 405). At 410, controller 150 calculates the average arc density (ADAVG) over the previous 100 ms. Controller 150 may average occurrences of arcs sampled every 100 ms over a longer period (e.g., 4-5 seconds) to damp the control loop. At 415, controller 415 calculates a current limit (ILIM) for power supply 130 as indicated. ADTHRESH is a predetermined arc-frequency threshold (e.g., 5-10 arcs/second) used to control whether vapor deposition system 100 operates in target-conditioning mode or normal processing mode. ILIMMIN and ILIMMAX are user-provided minimum and maximum output current values, respectively. If ADAVG exceeds ADMAX, ILIM is set to ILIMMIN. In one illustrative embodiment, ADMAX is 250 arcs/second.

If ILIM calculated at 415 exceeds ILIMMAX at 420, ILIM is limited to ILIMMAX at 425. If, on the other hand, ILIM is less than ILIMMIN at 430, ILIM is set to ILIMMIN at 435. At 440, controller 150 applies ILIM to the control loop, and the process proceeds to step 445 in FIG. 4B.

If ADAVG determined at 410 is less than or equal to ADTHRESH at 445, the arc delay time $\Delta t$ ("TD" in FIG. 4B) is set to zero at 450, meaning that target conditioning is complete and that vapor deposition system 100 can resume normal processing. If ADAVG exceeds ADTHRESH at 445, the process proceeds to 455. At 455, controller 150 calculates the arc delay time TD as indicated. "EARC" in FIG. 4B is the predetermined constant energy to be delivered to each arc. In other words, EARC is the constant value to which $E_{del}$ is set for each detected arc. In some embodiments, EARC is approximately equal to $E_{max}$. "VARC" in FIG. 4B is the output voltage of power supply 130 during the arc delay time TD. In some embodiments, VARC is measured. In other embodiments, VARC is approximated as a predetermined constant. At 460, controller 150 applies the calculated arc delay time TD to the control loop.

Figure 5A:
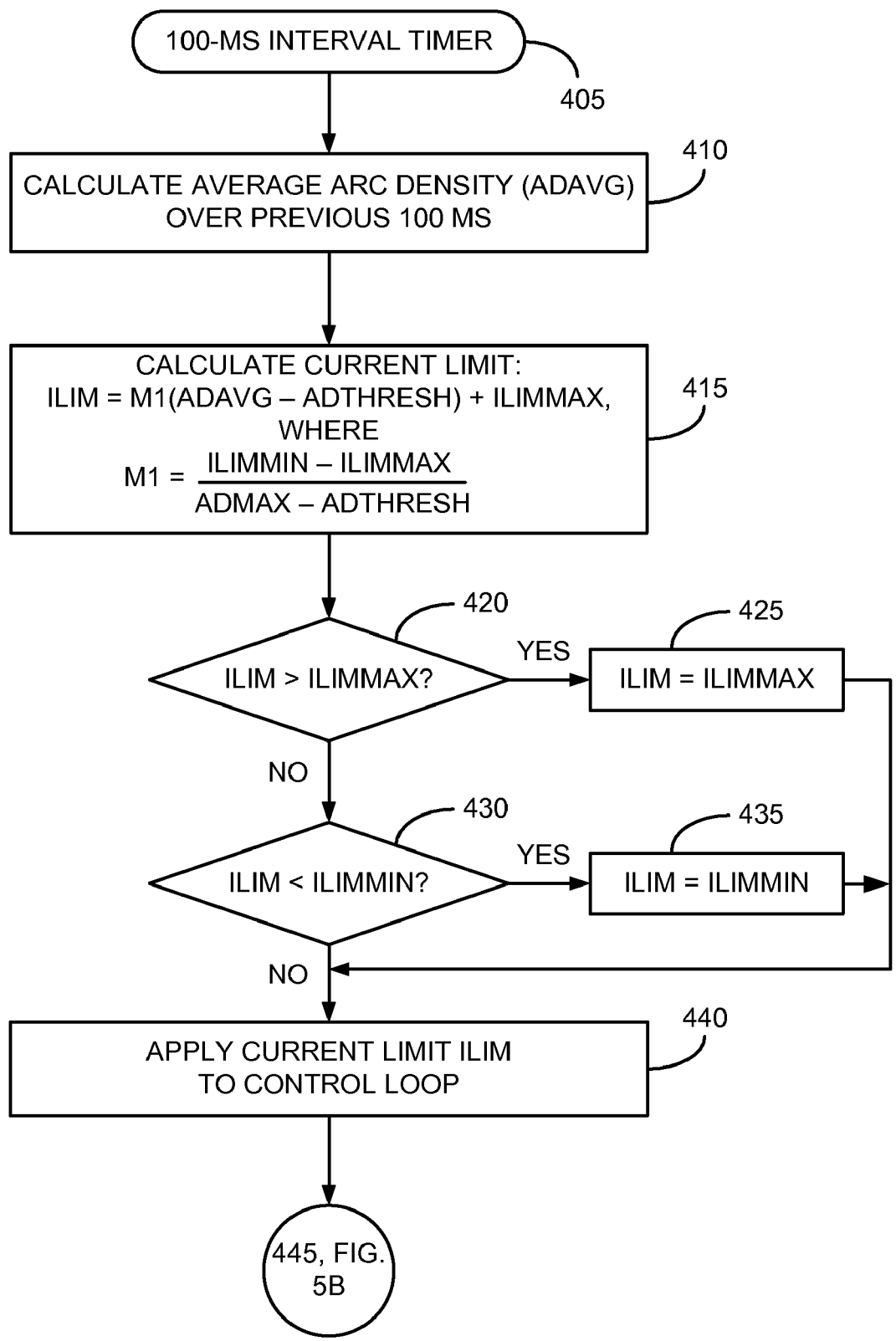
FIGS. 5A and 5B are a flowchart of a method for conditioning a vapor deposition target, in accordance with yet another illustrative embodiment of the invention.
Figure 5B:
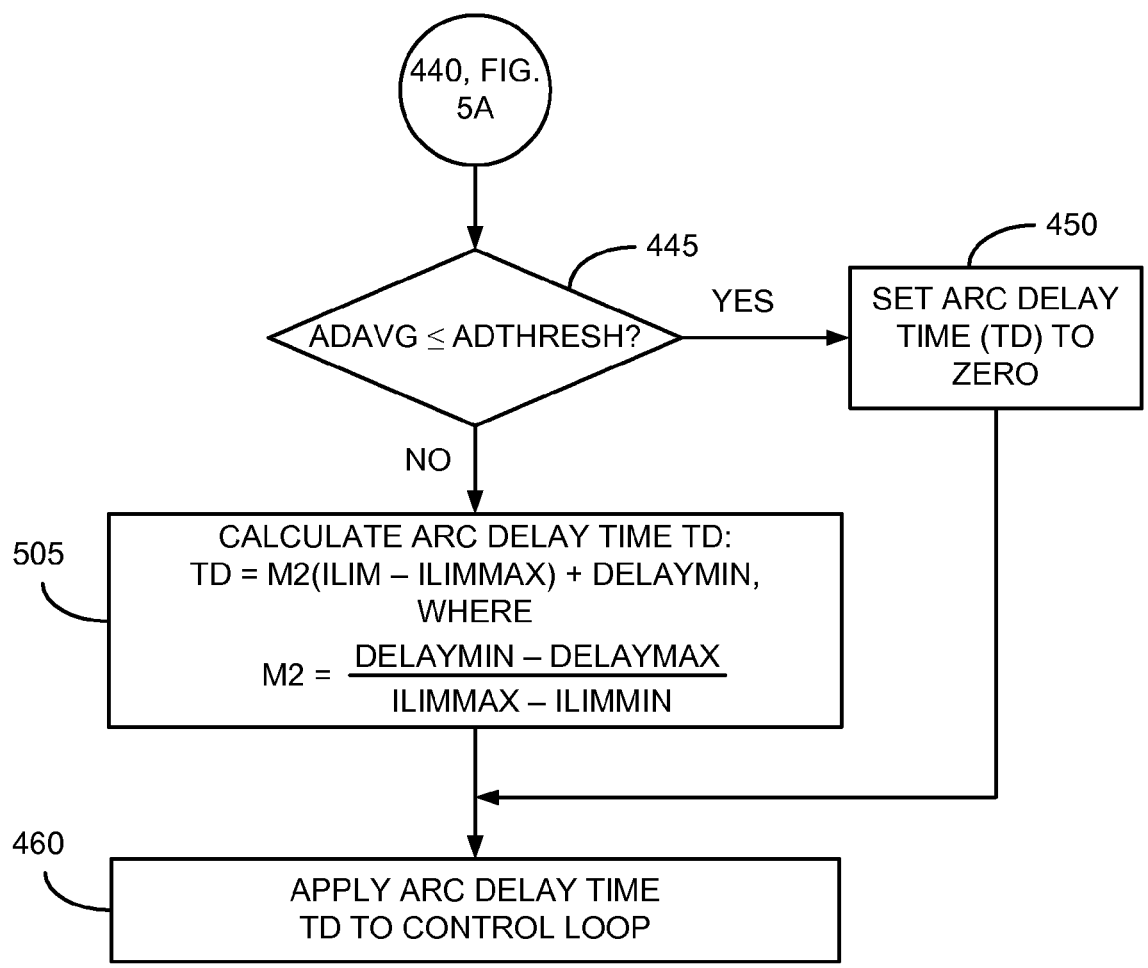

FIGS. 5A and 5B are a flowchart of a method for conditioning a vapor deposition target 120, in accordance with yet another illustrative embodiment of the invention. Ideally, the output current of power supply 130 would remain the same before and after the onset of an arc. In practice, a the output current may rise significantly until the arc delay time TD expires and output 140 is shut off for a predetermined period to extinguish the arc. To compensate for this non-ideal behavior, the illustrative embodiment shown in FIGS. 5A and 5B adjusts the current limit (ILIM) and arc delay time (TD) so that output 140 of power supply 130 satisfies the objective of delivering substantially the same energy to each arc. Optionally, that constant arc energy is made approximately equal to $E_{max}$. The illustrative embodiment shown in FIGS. 5A and 5B treats the output voltage ($V_{out}$) of power supply 130 as being constant (e.g., 30-50V). The product of output current and arc delay time ($I_{out} \cdot \Delta t$) is controlled to be approximately equal to the ratio of the predetermined $E_{del}$ to the known constant output voltage $V_{out}$. Therefore, this particular illustrative embodiment operates based on $I_{out} \cdot \Delta t$.

The primary difference between the embodiment shown in FIGS. 4A and 4B and that shown in FIGS. 5A and 5B occurs at step 505 in FIG. 5B. In this embodiment, TD is calculated as indicated in block 505. DELAYMIN and DELAYMAX are predetermined minimum and maximum allowable arc delay times, respectively. In one illustrative embodiment, DELAYMIN is 33 µs, and DELAYMAX is 250 µs.

In conclusion, the present invention provides, among other things, a method and system for conditioning a vapor deposition target. Those skilled in the art can readily recognize that numerous variations and substitutions may be made in the invention, its use and its configuration to achieve substantially the same results as achieved by the embodiments described herein. Accordingly, there is no intention to limit the invention to the disclosed illustrative forms. Many variations, modifications and alternative constructions fall within the scope and spirit of the disclosed invention as expressed in the claims.

What is claimed is:

1. A method for controlling a vapor deposition process, comprising:
    operating a vapor deposition system in which a vapor deposition target is used;
    detecting the occurrence of electrical arcs in the vapor deposition system; and
    adjusting a level of current output from a power supply that provides power to the vapor deposition system and adjusting an interval during which energy is delivered to each arc to deliver substantially the same energy to each arc.

2. The method of claim 1, wherein the energy delivered to each arc is approximately equal to the maximum energy that the vapor deposition target can withstand without being damaged.

3. The method of claim 1, wherein the adjusting is performed until a measured arc frequency falls below a predetermined threshold.

4. The method of claim 1, wherein the power supply is switched to a constant current mode when an arc is detected.

5. The method of claim 1, wherein the current that is output is regulated to be inversely proportional to a measured arc frequency when the measured arc frequency exceeds a predetermined threshold.

6. The method of claim 1, wherein adjusting the interval during which energy is delivered to each arc includes:
    measuring, during an arc delay time, the output current and an output voltage of the power supply; and
    calculating the interval during which energy is delivered to each arc based on the substantially the same energy to be delivered to each arc, the measured output current, and the measured output voltage.

7. The method of claim 6, wherein, during the arc delay time, the output voltage is approximated as a predetermined constant rather than being measured, the interval during which energy is delivered to each arc being calculated based on the substantially the same energy to be delivered to each arc, the measured output current, and the approximate output voltage.

8. A method for controlling a vapor deposition process, comprising:
    operating the vapor deposition process at a user-specified output power, the vapor deposition process being powered by a power supply; and
    conditioning, responsive to a measured arc frequency exceeding a threshold, a vapor deposition target by adjusting an output current of the power supply that powers the vapor deposition process and adjusting an interval during which energy is delivered to each arc to deliver substantially the same energy to each arc.

9. The method of claim 8, wherein the energy delivered to each arc is approximately equal to the maximum energy that a vapor deposition target used in the vapor deposition process can withstand without being damaged.

10. The method of claim 8, further comprising:
    resuming operation of the vapor deposition process at the user-specified output power, after the measured arc frequency has fallen below the threshold.

11. The method of claim 8, wherein, responsive to a measured arc frequency exceeding a threshold, the power supply is switched to a current regulation mode in which the output current of the power supply is held substantially constant at a predetermined level regardless of whether an arc is present.

12. A power supply for a vapor deposition system, comprising:
    input lines to receive input power;
    output lines to supply output power to a vapor deposition process;
    a power converter to convert the input power to the output power; and
    a controller connected with the power converter, the controller being configured to adjust, responsive to the occurrence of electrical arcs in the vapor deposition system, an output current of the output power and to adjust an interval during which energy is delivered to each arc to deliver substantially the same energy to each arc.

13. The power supply of claim 12, wherein the energy the controller is configured to deliver to each arc is approximately equal to the maximum energy a vapor deposition target used in the vapor deposition process can withstand without being damaged.

14. The power supply of claim 12, wherein the power converter converts alternating current to direct current.

15. The power supply of claim 12, wherein the controller is configured to switch the power converter to a constant current mode when an arc is detected.

16. The power supply of claim 12, wherein the controller is configured to adjust the output current to be inversely proportional to a measured arc frequency when the measured arc frequency exceeds a predetermined threshold.

17. The power supply of claim 12, wherein the controller is configured to:
    measure, during an arc delay time, the output current and an output voltage of the power supply; and
    calculate the interval during which energy is delivered to each arc based on the substantially the same energy to be delivered to each arc, the measured output current, and the measured output voltage.

18. The power supply of claim 17, wherein the controller is configured to:
    approximate the output voltage during the arc delay time as a predetermined constant; and
    calculate the interval during which energy is delivered to each arc based on the substantially the same energy to be delivered to each arc, the measured output current, and the approximate output voltage.

* * * * *